(12) United States Patent
Fan (10) Patent No.: US 7,605,018 B2
(45) Date of Patent: Oct. 20, 2009

(54) METHOD FOR FORMING A DIE-ATTACH LAYER DURING SEMICONDUCTOR PACKAGING PROCESSES

(75) Inventor: Wen-Jeng Fan, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 0 days.

(21) Appl. No.: 12/007,008

(22) Filed: Jan. 4, 2008

(65) Prior Publication Data
US 2009/0176334 A1     Jul. 9, 2009

(51) Int. Cl.
*H01L 21/44* (2006.01)
(52) U.S. Cl. .................... 438/106; 438/124; 438/126; 438/127
(58) Field of Classification Search ......... 257/678–733, 257/787–796, E23.001–E23.194; 438/15, 438/26, 51, 55, 64, 106, 124–127
See application file for complete search history.

(56) References Cited

U.S. PATENT DOCUMENTS

2003/0030140 A1* 2/2003 Shim .......................... 257/712

2007/0040261 A1* 2/2007 Hetzel et al. ................. 257/686

\* cited by examiner

*Primary Examiner*—Sue Purvis
*Assistant Examiner*—Mamadou Diallo
(74) *Attorney, Agent, or Firm*—Muncy, Geissler, Olds & Lowe, PLLC (57) ABSTRACT

Disclosed is a method for forming a die-attach layer during semiconductor packaging processes. A chip carrier includes a substrate core and a stiffener. Top surface of the substrate core includes a plurality of die-attaching units and a peripheral area enclosed by the stiffener. A non-planar printing stencil is also provided. When the non-planar printing stencil is pressed against the chip carrier, the non-planar printing stencil is compliantly in contact with the substrate core and the stiffener and a plurality of printing openings of the non-planar printing stencil exposes the substrate core within the die-attaching units. During stencil printing, die-attach material fills in the printing openings to directly adhere to the substrate core. Therefore, the warpage of the substrate core is restrained to avoid bleeding of die-attach material so that die-attach materials can be formed as a die-attach layer with a uniform thickness on core-exposed chip carrier with lower costs. Additionally, the chip carrier will not be deformed during semiconductor packaging processes.

7 Claims, 8 Drawing Sheets

METHOD FOR FORMING A DIE-ATTACH LAYER DURING SEMICONDUCTOR PACKAGING PROCESSES

FIELD OF THE INVENTION

The present invention relates to a fabrication technology of semiconductor devices, especially to a method for forming a die-attach layer during semiconductor packaging processes.

BACKGROUND OF THE INVENTION

In conventional semiconductor devices, a chip in package is attached to a substrate by a die-attach material. There are two major types of forming die-attach materials where one is in either paste or liquid disposed by printing or dispensing. Another one is utilizing a die-attach tape where the die-attach tape is preformed as a tape in solid state and then attached to a substrate. The former has the advantages of saving die-attach materials with flexible printing die-attaching area, however, it is very sensitive to substrate warpage leading to bleeding of die-attach materials. Since solder masks are disposed on both top and bottom surfaces of the substrate, therefore, the substrate warpage is not an issue for now. But when the substrate structure is changed, the die-attach material has to be changed as well.

Figure 1:
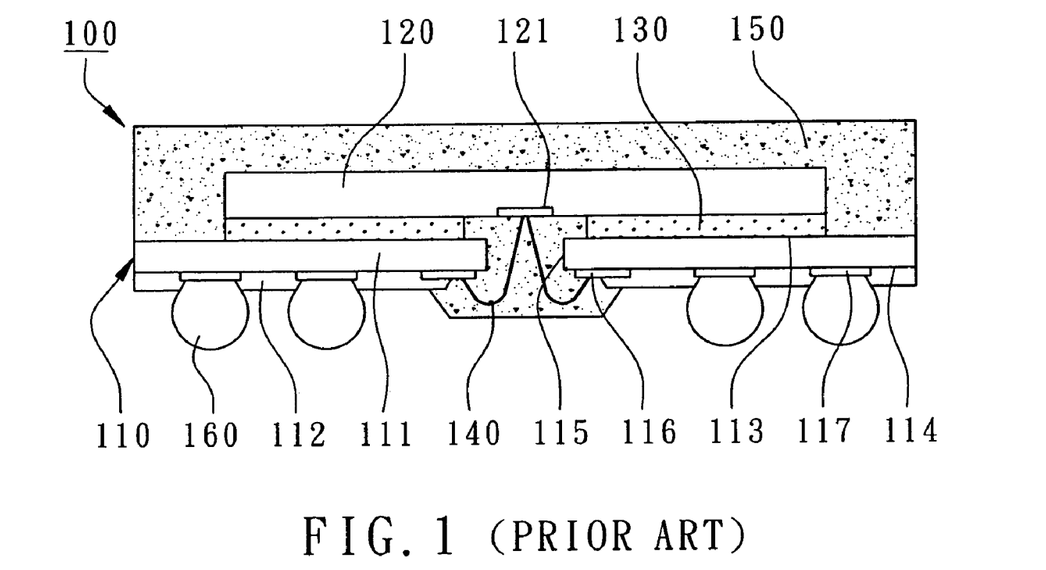
FIG. 1 shows a cross-sectional view of a conventional semiconductor package.

As shown in FIG. 1, a conventional semiconductor package 100 primarily comprises a substrate 110, a chip 120, a die-attach tape 130, a plurality of bonding wires 140, and an encapsulant 150. The substrate 110 comprises a core layer 111 and only one bottom solder mask 112 disposed over the bottom surface 114 of the core layer 111. Since there is no solder mask disposed on the top surface 113 of the core layer 111, therefore, the die-attach tape 130 is disposed directly to the core layer 111 to adhere the chip 120. The bonding pads 121 of the chip 120 are electrically connected to the corresponding bonding fingers 116 of the substrate 110 by the bonding wires 140 passing through the wire-bonding slot 115 of the substrate 110. The encapsulant 150 encapsulates the chip 120 and the bonding wires 140. A plurality of solder balls 160 are bonded to the ball pads 117 of the substrate 110. The material of the core layer 111 of the substrate 110 is made of glass fiber reinforced resin which has better adhesion to the die-attach tape 130 or other resin-based die-attach materials to enhance die-attaching strength to the chip 120. Since only the bottom solder mask 112 is disposed on the bottom surface 114 of the substrate 110, substrate warpage become worse, especially using substrate strips for semiconductor packaging, leading to difficulties of printing liquid-type die-attach materials directly on the core layer 111 of the substrate 110. Moreover, a substrate strip with severe substrate warpage can not easily be transported nor handled by the packaging equipment during packaging processes. Another method to manufacture the conventional semiconductor package 100 is to singulate the substrate 110 into individual substrate units to reduce substrate warpage. However, it is very difficult to print liquid-type die-attach materials on each individual substrate unit, moreover, individual substrate units are also very difficult to transport and handle by the packaging equipment during packaging processes. Handling individual substrate units will greatly increase packaging costs.

SUMMARY OF THE INVENTION

The main purpose of the present invention is to provide a method for forming a die-attach layer during semiconductor packaging processes by stencil printing of die-attach materials on the substrate core of a chip carrier to enhance die-attaching strength. Moreover, a stiffener is attached to the chip carrier and a non-planar printing stencil is implemented to suppress substrate warpage to avoid bleeding of die-attach materials leading to lower costs of forming die-attach materials on a chip carrier with enhanced die-attaching strength.

According to the present invention, a method for forming a die-attach layer during semiconductor packaging processes primarily comprises the following steps. Firstly, a chip carrier is provided, where the chip carrier includes a substrate core and a stiffener. Top surface of the substrate core includes a plurality of die-attaching units and a peripheral area enclosing the die-attaching units where the stiffener is partially formed on the top surface of the substrate core to cover the peripheral area without covering die-attaching units. Then, a non-planar printing stencil is provided, where the non-planar printing stencil has a non-planar contact surface with a reduced thickness at its peripheries. The non-planar printing stencil further has a plurality of printing openings. When the non-planar printing stencil is pressed against the chip carrier, the die-attaching units of the substrate core are exposed from the printing openings, and the non-planar printing stencil is compliantly in contact with the substrate core and the stiffener. Finally, a die-attach material is applied to the die-attaching units on the substrate core through the printing openings of the non-planar printing stencil.

DETAIL DESCRIPTION OF THE INVENTION

Please refer to the attached drawings, the present invention will be described by means of embodiment below.

Figure 2A:
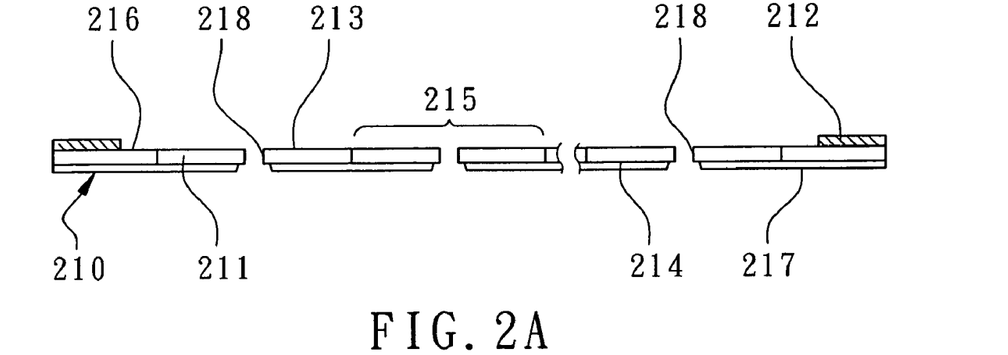
FIGS. 2A to 2E show the cross-sectional views of a chip carrier during the packaging processes to form a die-attach layer according to the preferred embodiment of the present invention.

A method for forming a die-attach layer during semiconductor packaging processes is revealed as shown from FIG. 2A to 2E. Firstly, as shown in FIG. 2A and FIG. 3, a chip carrier 210 is provided where the chip carrier 210 includes a substrate core 211 and a stiffener 212. The top surface 213 of the substrate core 211 includes a plurality of die-attaching units 215 and a peripheral area 216 enclosing the die-attaching units 215. As shown in FIG. 3, the stiffener 212 is attached to some portion of the top surface 213 of the substrate core 211 to cover the peripheral area 216 without covering the die-attaching units 215 to enhance the strength of the chip carrier 210 and to avoid warpage of the chip carrier 210 for the following semiconductor packaging processes. In the present embodiment, the chip carrier 210 can be a printed circuit board having a bottom solder mask 217 to cover most of the bottom surface 214 of the substrate core 211 where the covering area of the bottom solder mask 217 is greater than the one of the stiffener 212 on the top surface 213. In the present embodiment, as shown in FIG. 3, the stiffener 212 is a closed frame. The stiffener 212 can be a thick patterned solder mask without covering the die-attaching units 215 of the substrate core 211. The thickness of the stiffener 212 is thicker than the one of the bottom solder mask 217. As shown in FIG. 3 again, in the present embodiment, the chip carrier 210 can be a substrate strip with at least a wire-bonding slot formed in each die-attaching unit 215.

Figure 2B:
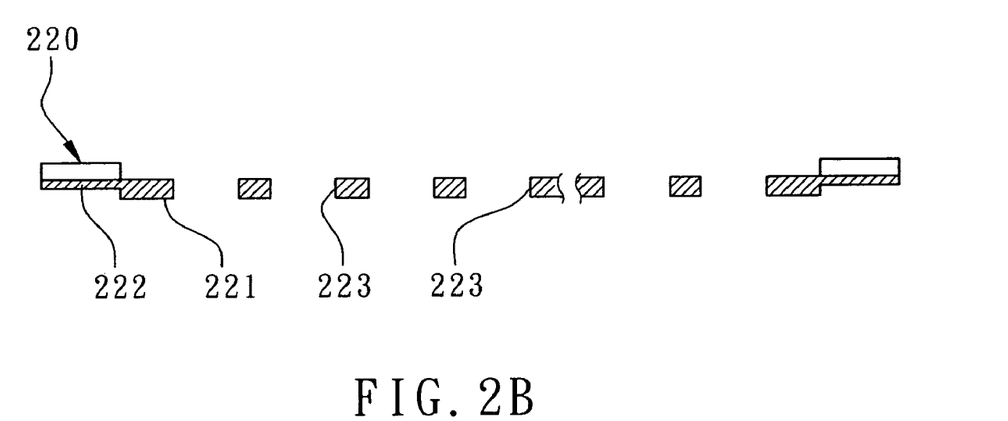
Figure 3:
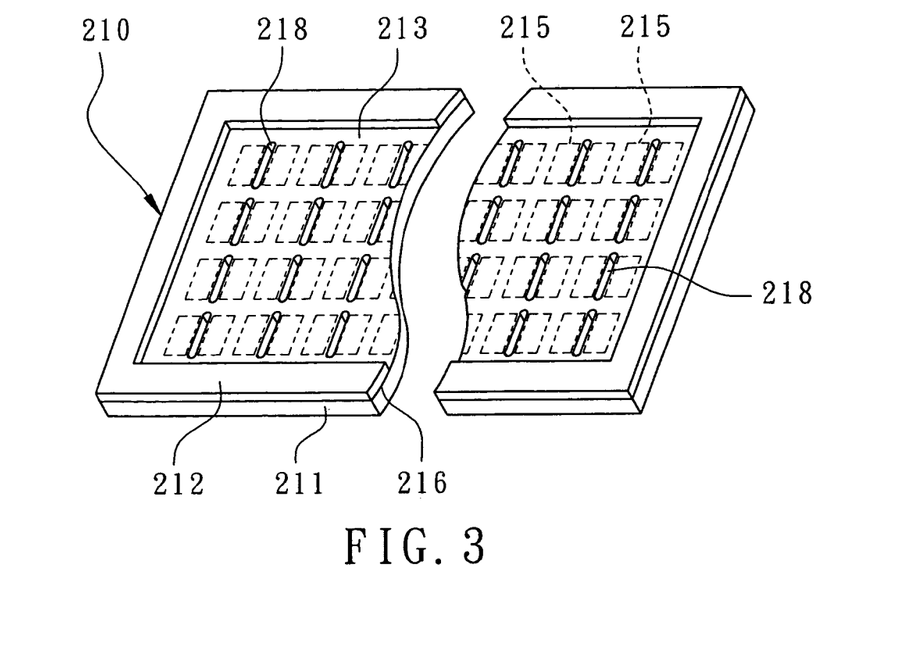
FIG. 3 shows the top view of the chip carrier according to the preferred embodiment of the present invention.
Figure 4:
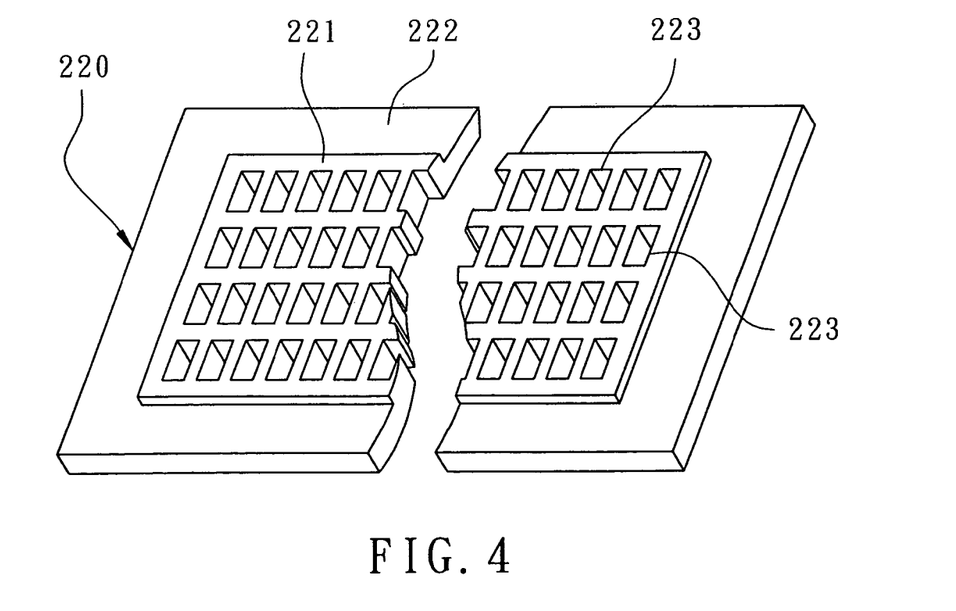
FIG. 4 shows the non-planar contact surface of a non-planar printing stencil utilized for forming a die-attach layer according to the preferred embodiment of the present invention.

Then, as shown in FIG. 2B and FIG. 4, a non-planar printing stencil 220 is provided. The non-planar printing stencil 220 has a non-planar contact surface 221 where the thickness at the peripheries 222 of the non-planar contact surface 221 is reduced to compensate the thickness of the stiffener 212. Moreover, the non-planar printing stencil 220 further has a plurality of printing openings 223 aligned to and smaller than the die-attaching units 215 of the substrate core 211.

Figure 2C:
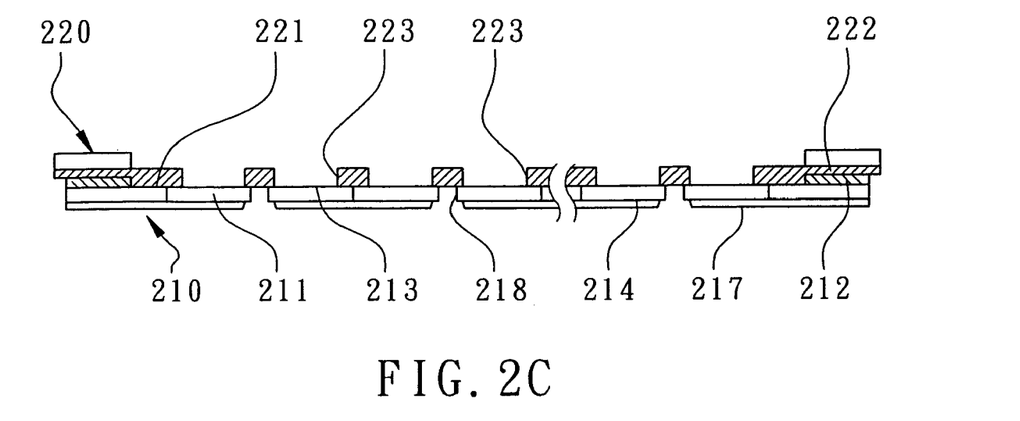

Then, as shown in FIG. 2C, the non-planar printing stencil 220 is aligned and pressed against the chip carrier 210 with the die-attaching units 215 of the substrate core 211 exposed from the printing openings 223. Moreover, the non-planar printing stencil 220 is compliantly in contact with the substrate core 211 and the stiffener 212. As shown in FIG. 2C again, the non-planar printing stencil 220 completely covers and seals the wire-bonding slots 218 of the substrate core 211.

Figure 2D:
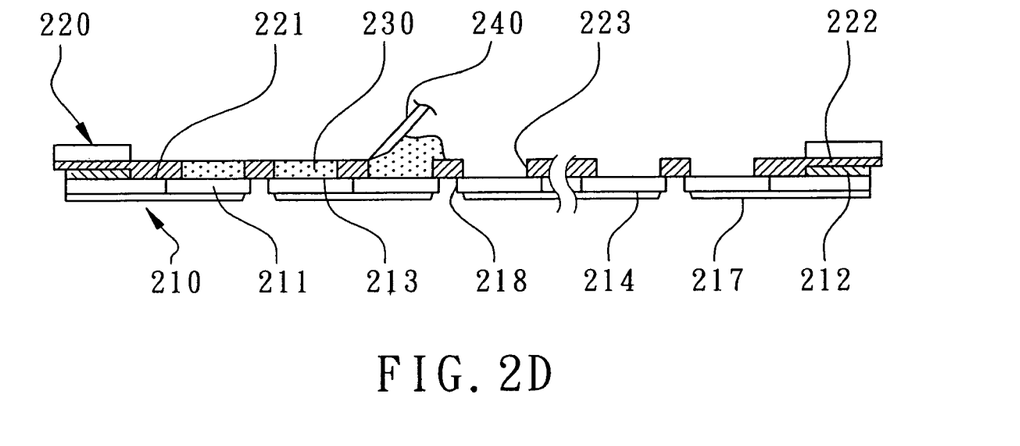

Finally, as shown in FIG. 2D and FIG. 3, by stencil printing, a die-attach material 230 is applied to the die-attaching units 215 on the substrate core 211 through the printing openings 223 of the non-planar printing stencil 220. During the stencil printing process, the die-attach material 230 fills in the printing openings 223 of the non-planar printing stencil 220 by a scraper 240 and formed on the die-attaching units 215 of the substrate core 211. The printed thickness of the die-attach material 230 can be controlled by the non-planar printing stencil 220. Since the die-attach material 230 directly adheres to the substrate core 211 so that the die-attaching strength is enhanced. Preferably, the die-attach material 230 is chosen from liquid or paste such as liquid epoxy or B-stage paste to reduce die-attaching costs. In the present embodiment, as shown in FIG. 2D and FIG. 3, the non-planar printing stencil 220 completely covers the wire-bonding slots 218 to avoid bleeding of die-attach material 230 into wire-bonding slots 218 without affecting the following packaging processes.

Figure 2E:
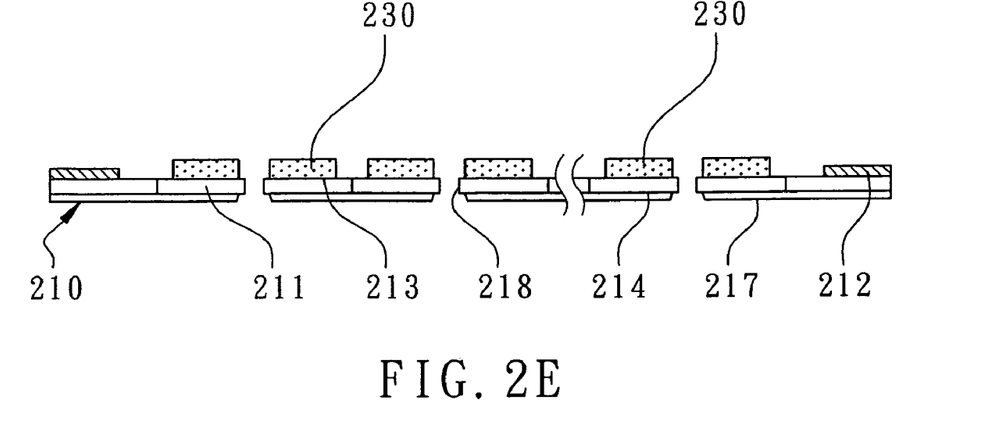

To be more specific, as shown in FIG. 2E, the method mentioned above further comprises a pre-baking step to partially cure the die-attach material 230 to form a die-attach layer with a uniform thickness directly adhering to the substrate core 211. Preferably, the die-attach material 230 can be an almost immobile B-stage paste without any adhesion at room temperature, however, after heating the die-attach material 230 will become adhesive for die attachment.

Therefore, according to the method mentioned above, the die-attach material 230 can directly be disposed on the substrate core 211 by a printing stencil to enhance die-attaching strength, to restrain warpage of the chip carrier 210, and to avoid bleeding of the die-attach material 230 as well as to reduce packaging costs of semiconductor packages.

Figure 5A:
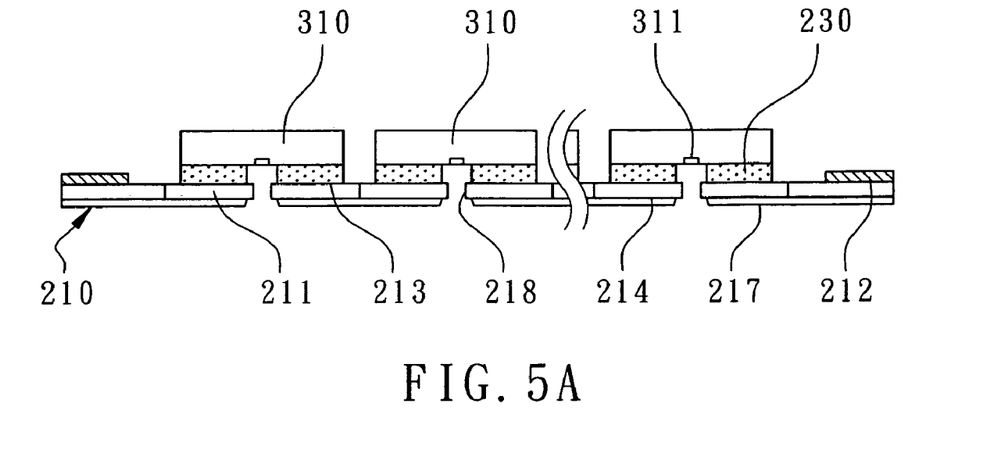
FIGS. 5A to 5E show the cross-sectional views of the chip carrier with the die-attach layer i during semiconductor packaging processes according to the preferred embodiment of the present invention.
Figure 5B:
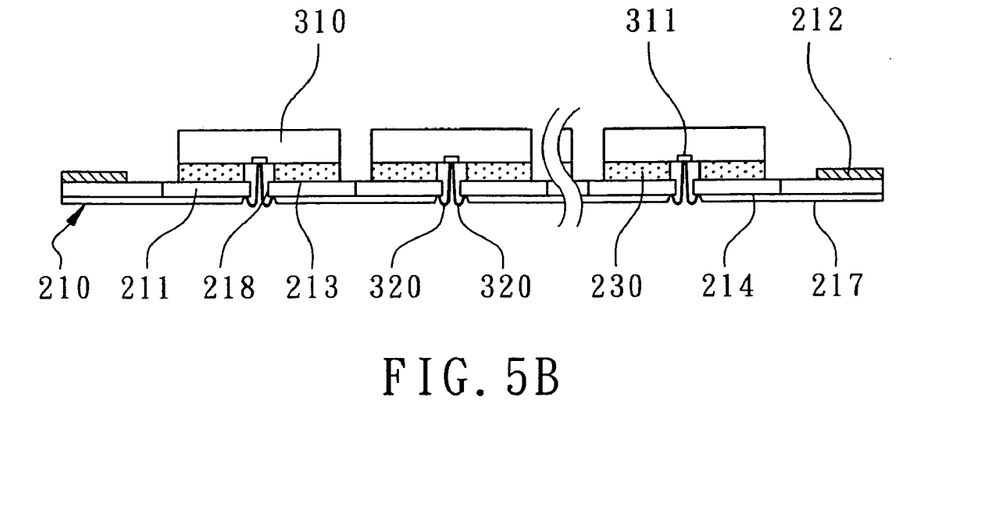

The method for forming a die-attach layer is implemented in the semiconductor packaging processes is shown from FIG. 5A to FIG. 5E. As shown in FIG. 5A, a plurality of chips 310 with a plurality of bonding pads 311 are disposed on the corresponding die-attaching units 215 of the chip carrier 210 by the die-attach material 230 after proper heating and pressing. The chips 310 are attached to the chip carrier 210 with the active surfaces faced to the chip carrier 210 and with the bonding pads 311 aligned within the wire-bonding slots 218 of the corresponding die-attaching units 215. Then, as shown in FIG. 5B, the chips 310 are electrically connected to the chip carrier 210 by a plurality of bonding wires 320. In the present embodiment, the bonding pads 311 of the chips 310 are electrically connected to the corresponding bonding fingers, not shown in the figure, of the substrate core 211 by the plurality of bonding wires 320 passing through the wire-bonding slots 218 of the corresponding die-attaching units 215.

Figure 5C:
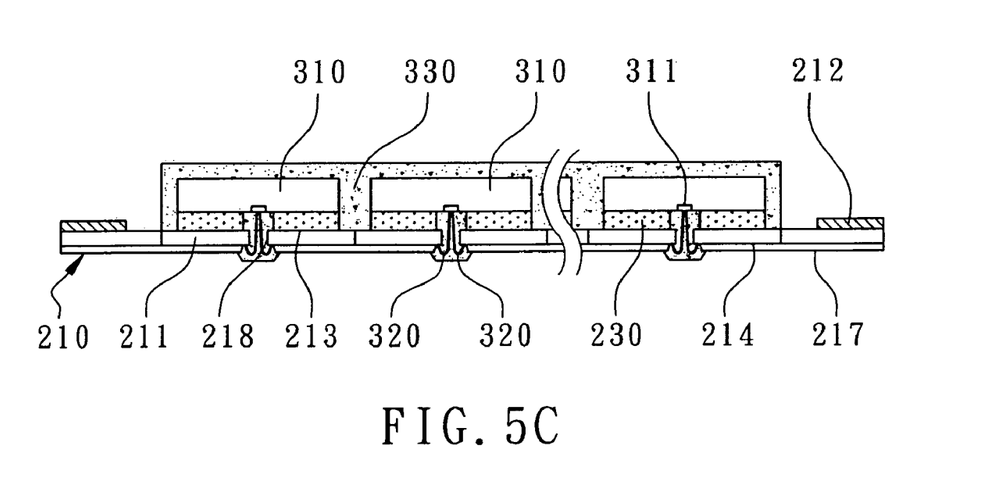
Figure 5D:
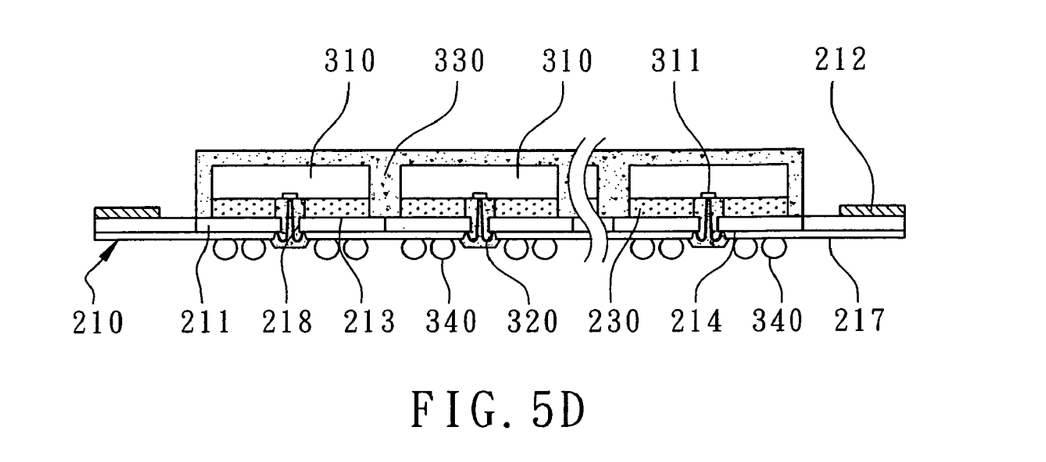
Figure 5E:
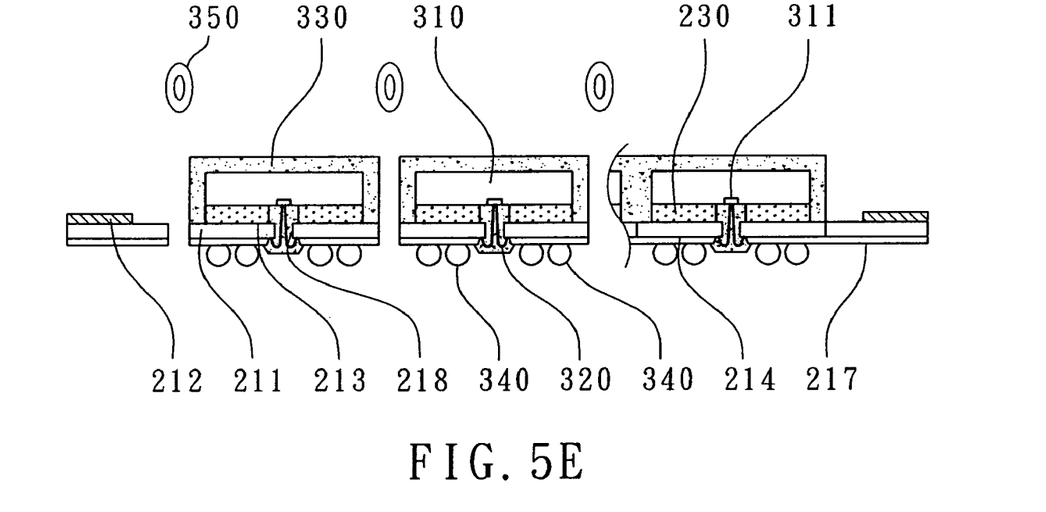

Then, as shown in FIG. 5C, an encapsulant 330 is formed over the top surface 213 and partially formed on the bottom surface 214 of the substrate core 211 and in the wire-bonding slots 218 to encapsulate the chips 310 and the bonding wires 320. Normally, the encapsulant 330 is EMC (Epoxy Molding Compound) made by transfer molding. After encapsulation, as shown in FIG. 5D, a plurality of solder balls 340 are disposed on the bottom surface 214 of the substrate core 211 as external terminals for mounting to a printed circuit board, not shown in the figure. Finally, as shown in FIG. 5E, the encapsulant 330 and the chip carrier 210 are singluated by a saw 350 to form a plurality of individual semiconductor packages. As shown in FIG. 5E again, the stiffener 212 will be removed during package singulation so that the final semiconductor package structure will not be changed.

Therefore, by the method for forming a die-attach layer during semiconductor packaging processes reveraled in the present invention, lower material costs of liquid adhesive or paste-type adhesive (die-attach materials 230) with lower equipment costs of stencil printing can be implemented to form a die-attach layer to reduce packaging costs and to increase package reliability by a die-attaching enhanced chip carrier having an exposed core for die bonding. The warpage of the chip carrier is restrained to avoid handling and alignment issues due to substrate warpage in the following packaging processes leading to higher packaging productivity and better package quality. Furthermore, the bleeding of the die-attach material 230 is eliminated to ensure good electrical contacts of the bonding wires 320 leading better package reliability.

The above description of embodiments of this invention is intended to be illustrative and not limiting. Other embodiments of this invention will be obvious to those skilled in the art in view of the above disclosure.

What is claimed is:

1. A method for forming a die-attach layer during semiconductor packaging processes, primarily comprising the steps of:
   providing a chip carrier, including a substrate core and a stiffener, the substrate core having a top surface including a plurality of die-attaching units and a peripheral area, wherein the stiffener is attached to the peripheral area of the top surface without covering the die-attaching units;
   providing a non-planar printing stencil, having a non-planar contact surface, wherein the thickness at the peripheries of the non-planar contact surface is reduced to compensate the thickness of the stiffener, wherein the non-planar printing stencil further has a plurality of printing openings;
   pressing the non-planar printing stencil against the chip carrier in a manner that the die-attaching units of the substrate core are exposed from the printing openings, and the non-planar printing stencil is compliantly in contact with the substrate core and the stiffener; and
   printing die-attach material through the printing openings of the non-planar printing stencil to apply to the die-attaching units on the substrate core.

2. The method as claimed in claim 1, wherein the stiffener is a closed frame.

3. The method as claimed in claim 1, wherein the chip carrier is a printed circuit board further including a bottom solder mask covering most of the bottom surface of the substrate core, and wherein the covering area of the bottom solder mask is greater than the one of the stiffener.

4. The method as claimed in claim 3, wherein the stiffener is a thick patterned solder mask without covering the die-attaching units of the substrate core, and the thickness of the stiffener is thicker than the one of the bottom solder mask.

5. The method as claimed in claim 1, further comprising a pre-baking step to partially cure the die-attach material to form a die-attach layer with a uniform thickness directly adhering to the substrate core.

6. The method as claimed in claim 1, wherein the chip carrier is a substrate strip with at least a wire-bonding slot formed in each die-attaching unit, and wherein pressing the non-planar printing stencil comprises complete covering the wire-bonding slots by the non-planar printing stencil.

7. The method as claimed in claim 1, further comprising a step of removing the non-planar printing stencil from the chip carrier.

* * * * *